United States Patent
Au et al.

(10) Patent No.: US 11,523,539 B2
(45) Date of Patent: Dec. 6, 2022

(54) SHROUD FOR AN INTEGRATED CIRCUIT HEAT EXCHANGER

(71) Applicant: NVIDIA CORPORATION, Santa Clara, CA (US)

(72) Inventors: Nelson Au, Foster City, CA (US); Glenn Wernig, San Jose, CA (US); Jeongyong Jeon, Irvine, CA (US); Susheela Narasimhan, Fremont, CA (US)

(73) Assignee: NVIDIA Corporation, Santa Clara, CA (US)

( * ) Notice: Subject to any disclaimer, the term of this patent is extended or adjusted under 35 U.S.C. 154(b) by 134 days.

(21) Appl. No.: 16/857,137

(22) Filed: Apr. 23, 2020

(65) Prior Publication Data

US 2021/0105913 A1 Apr. 8, 2021

Related U.S. Application Data

(60) Provisional application No. 62/911,985, filed on Oct. 7, 2019.

(51) Int. Cl.
  *H05K 7/20* (2006.01)
  *G06F 1/20* (2006.01)
  *F28F 27/00* (2006.01)

(52) U.S. Cl.
  CPC ......... *H05K 7/20409* (2013.01); *F28F 27/00* (2013.01); *G06F 1/20* (2013.01); *H05K 7/20009* (2013.01)

(58) Field of Classification Search
  CPC ............. H01L 23/3672; H01L 23/4093; H01L 21/4882; G06F 1/20; G06F 1/206; H05K 7/20154; H05K 7/2039
  USPC .......... 165/80.3, 104.33, 80.2; 257/E23.099, 257/722, E23.103, 719, E23.086, 706, 257/718; 361/697, 704, 695, 719, 702, 361/703, 709, 696, 701, 718, 715
  See application file for complete search history.

(56) References Cited

U.S. PATENT DOCUMENTS

| | | | |
|---|---|---|---|
| 2003/0169567 A1* | 9/2003 | Tantoush | G06F 1/20 361/695 |
| 2006/0028798 A1 | 2/2006 | Wang | |
| 2006/0137861 A1 | 6/2006 | Wang et al. | |
| 2008/0066309 A1* | 3/2008 | Hsu | F28F 9/001 257/E23.099 |
| 2012/0080167 A1* | 4/2012 | Gao | H01L 23/3672 165/104.19 |
| 2017/0083058 A1* | 3/2017 | Janak | H05K 7/20145 |

OTHER PUBLICATIONS

International Search Report for application No. PCT/US2020/054154 dated Dec. 1, 2020.

* cited by examiner

*Primary Examiner* — Mandeep S Buttar
(74) *Attorney, Agent, or Firm* — Artegis Law Group, LLP

(57) ABSTRACT

A protective shroud includes a top plate, a first side plate that is adapted to be disposed proximate a first edge region of a plurality of cooling fins of a heat exchanger for an integrated circuit, and a second side plate that is adapted to be disposed proximate a second edge region of the plurality of cooling fins.

22 Claims, 9 Drawing Sheets

SHROUD FOR AN INTEGRATED CIRCUIT HEAT EXCHANGER

CROSS-REFERENCE TO RELATED APPLICATIONS

This application claims priority benefit of the United States Provisional Patent Application titled, "SHROUD FOR AN INTEGRATED CIRCUIT HEAT EXCHANGER", filed on Oct. 7, 2019 and having Ser. No. 62/911,985. The subject matter of this related application is hereby incorporated herein by reference.

BACKGROUND

Field of the Various Embodiments

The various embodiments relate generally to computer systems and computer architecture and, more specifically, to a shroud for an integrated circuit heat exchanger.

Description of the Related Art

In modern computing devices, central processing units (CPUs), graphics processing units (CPUs), and other integrated circuits (ICs) generate significant quantities of heat during use. This heat needs to be removed for the proper operation of the integrated circuit and computing device. For example, a single high-power chip, such as a CPU or GPU, can generate hundreds of watts of heat during operation, and, if this heat is not efficiently removed, the temperature of the chip can increase to a point at which the chip is at risk of being damaged. To prevent thermal damage during operation, many system implement clock-speed throttling when the operating temperature of the processor exceeds a certain threshold. Thus, in these systems, the processing speed of the high-power chip is constrained by both the chip design and how effectively heat is removed from the chip.

To reduce the impact that thermal constraints have on high-power chip performance, heat exchangers are often employed that allow high-power chips to operate at greater processing speeds and generate greater amounts of heat. Heat exchangers are designed to efficiently transfer heat from a chip to ambient air, and the air then carries the heat away from the chip. Heat exchangers can include passive devices, such as heat sinks, or more complex heat-transfer devices, such as heat pipes. Heat sinks generally include an array of fins that increase the effective surface area of the chip exposed to ambient air, while heat pipes rely on phase transition (e.g., evaporation of a liquid) to efficiently transfer heat between two solid interfaces. In some instances, heat pipes are used in conjunction with heat sinks to increase the amount of heat that can be removed from a high-power chip.

Heat exchangers for high-powered chips, such as GPUs and more advanced CPUs, typically include heat sinks with large numbers of delicate cooling fins that can be damaged quite easily. Because most of the outer surfaces of such heat exchanges are formed by the cooling fins, the edges and other portions of the cooling fins are typically handled when a heat exchanger is installed on or removed from a printed circuit board. Consequently, the cooling fins can be bent or otherwise damaged during the installation or replacement process. Among other things, bent cooling fins can block the flow of cooling air through the heat exchanger during operation, thereby reducing the overall heat removing capacity of the heat exchanger.

As the foregoing illustrates, what is needed in the art is a more effective way to protect heat exchangers when the heat exchangers are being handled.

SUMMARY

A protective shroud includes a top plate, a first side plate that is adapted to be disposed proximate a first edge region of a plurality of cooling fins of a heat exchanger for an integrated circuit, and a second side plate that is adapted to be disposed proximate a second edge region of the plurality of cooling fins.

At least one technical advantage of the disclosed shroud design relative to the prior art is that the disclosed design provides overall better protection of the cooling fins of a heater exchanger when the heat exchanger is being handled. Another advantage the disclosed design is improved cooling efficiency of the heat exchanger because the shroud channels cooling fluid through the cooling fins of the heat exchanger, thereby preventing the cooling fluid from bypassing the cooling fins. These technical advantages provide one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

Heat Exchanger Description

Figure 1A:
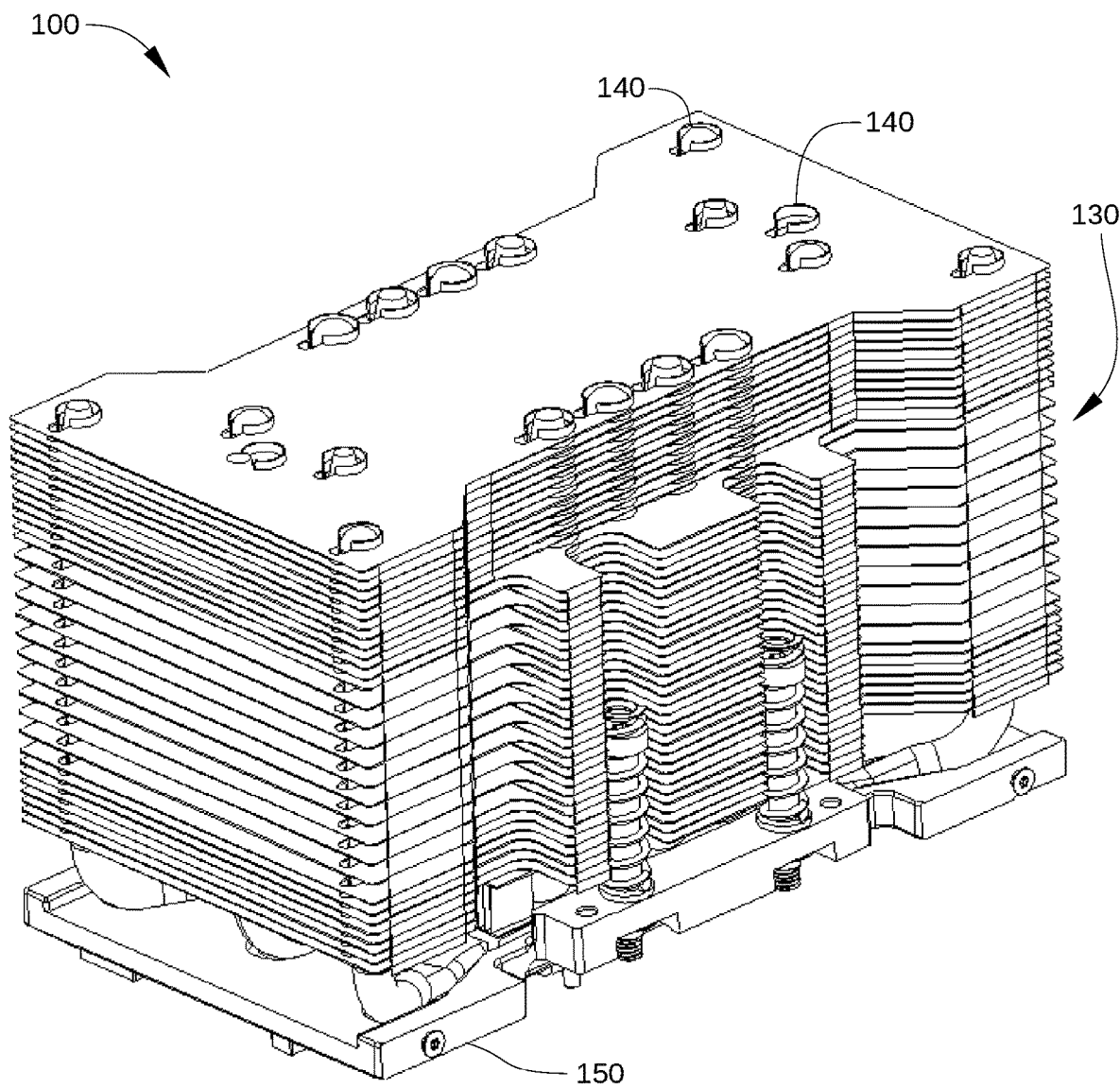
FIG. 1A is a perspective view of an example heat exchanger that can be implemented in accordance with one more aspects of the various embodiments.
Figure 1B:
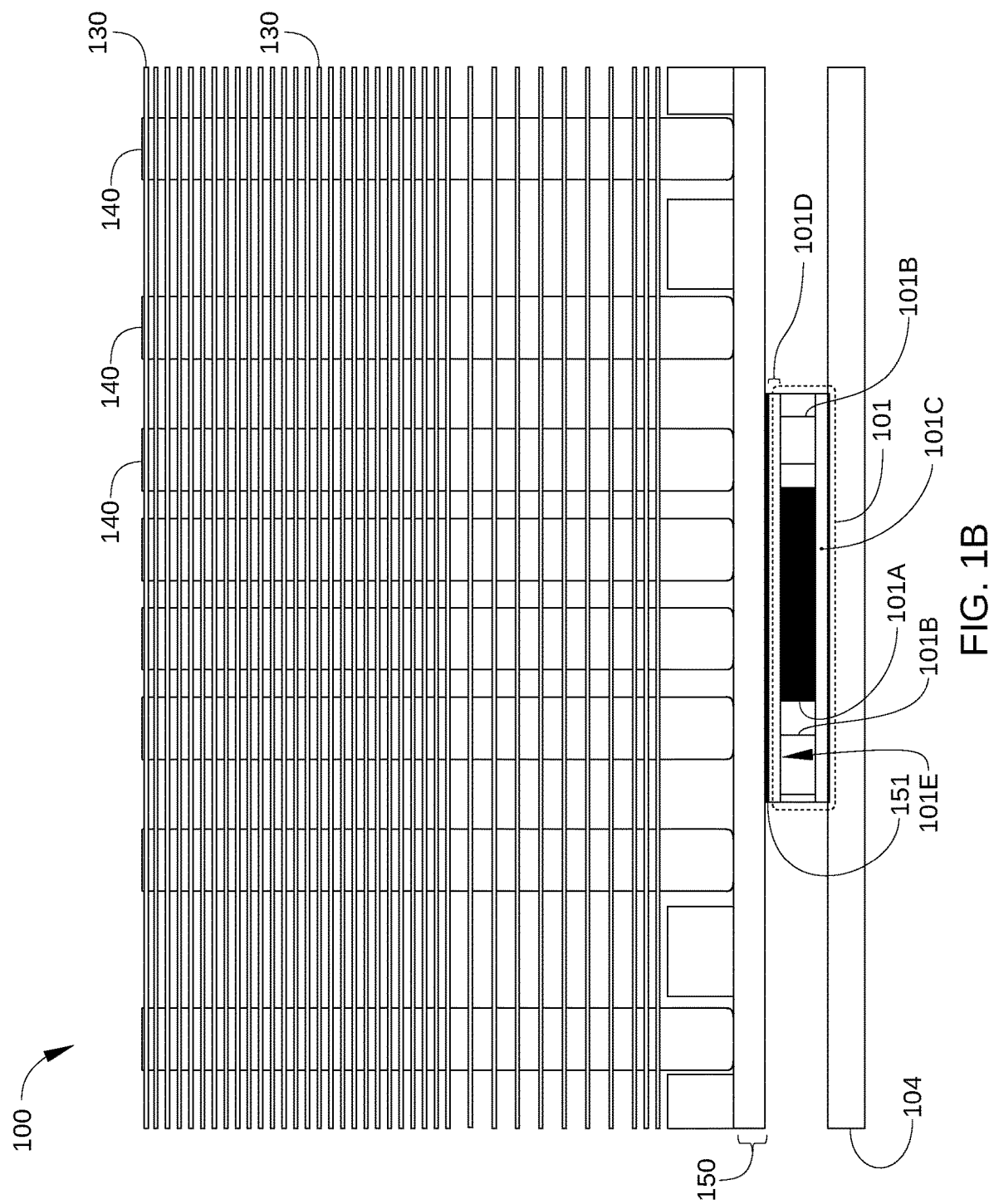
FIG. 1B is a side view of an example heat exchanger that can be implemented in accordance with one more aspects of the various embodiments.

FIG. 1A is a perspective view and FIG. 1B is a side view of a heat exchanger 100 that can be implemented with various embodiments. Heat exchanger 100 is a heat exchanger for an integrated circuit (IC) 101 and includes an integrated heat sink 120 and a plurality of cooling fins 130. Together, heat exchanger 100 and IC 101 form an electronic device that can be mounted on a printed circuit board (PCB) 104. In the embodiment illustrated in FIGS. 1A and 1B, heat sink 120 includes one or more heat pipes 140 thermally coupled to IC 101 and to cooling fins 130. In some embodiments, cooling fins 130 are directly attached to heat pipes 140.

In some embodiments, IC 101 includes a single microchip, such as a graphics processing unit (GPU) or central-processing unit (CPU). Alternatively, in some embodiments IC 101 includes multiple microchips, such as a processor die 101A and one or more stacks 101B of memory dies that are all mounted on a common packaging substrate 101C. In such embodiments, packaging substrate 101C can be configured for mounting IC 101 onto PCB 104, for example via solder balls (not shown). In addition, in such embodiments, IC 101 may include a package lid 101D, which protects processor die 101A and the one or more stacks 101B of memory dies from physical damage, but also increases thermal resistance associated with the packaging of IC 101. Further, in some multi-microchip embodiments, IC 101 can include other configurations of chips, such as a system-on-chip (SoC) configuration.

Heat pipes 140 are sealed vessels, such as copper tubes, that include an evaporative working fluid (not shown), such as water or alcohol. Heat pipes 140 efficiently transfer heat, through a combination of evaporation and condensation, from IC 101 to cooling fins 130 and on to cooling air (or any other cooling fluid) that passes over cooling fins 130. In the embodiment illustrated, heat pipes 140 are mounted on a metallic plate 150, such as a copper or aluminum plate, that is thermally coupled to IC 101. In such embodiments, metallic plate 150 can be thermally coupled to a major surface 101E of IC 101 via a thermal interface material (TIM) 151, for example a highly thermally conductive paste. Metallic plate 150 spreads heat over a surface area that is greater than that of IC 101. As a result, a larger number of heat pipes 140 can be thermally coupled to IC 101 on metallic plate 150 than when directly attached to IC 101.

Cooling fins 130 can be any material that conducts heat efficiently, such as copper or aluminum. Cooing fins 130 are oriented to allow a cooling fluid (referred to herein as "cooling air") to flow in an airflow direction 103 between cooling fins 130. In embodiments in which heat exchanger 100 includes heat pipes 140, the cooling air flowing between cooling fins 130 also flows across condenser portions of heat pipes 140.

In the embodiment illustrated in FIGS. 1A and 1B, heat exchanger 100 includes heat pipes 140. In other embodiments, heat exchanger 100 includes cooling fins 130 but no heat pipes 140. Further, in the embodiment illustrated in FIGS. 1A and 1B, heat exchanger 100, metallic plate 150, and IC 101 are configured as a single assembly that is mounted on PCB 104. In other embodiments, heat exchanger 100 is a separate assembly that is coupled to, mounted on, or otherwise attached to IC 101 after IC 101 is coupled to or mounted on PCB 104. In yet other embodiments, heat exchanger 100 is a separate assembly that is removably coupled to IC 101, for example via threaded fasteners, and heat exchanger 100 and IC 101 are mounted to PCB 104 as a single assembly.

Heat Exchanger Shroud

As noted above, cooling fins 130 included in heat exchanger 100 are fragile and easily damaged. Further, in some embodiments, heat exchanger 100 may be manually handled during manufacturing, shipping, and/or installation. As a result, the likelihood of heat exchanger 100 being installed with at least some bent or damaged cooling fins is considerable. Thus, according to some embodiments, a protective shroud is provided that at least partially encompasses and a heat exchanger, such as that shown and described herein. Embodiments of such a protective shroud are described below in conjunction with FIGS. 2-6B.

Figure 2:
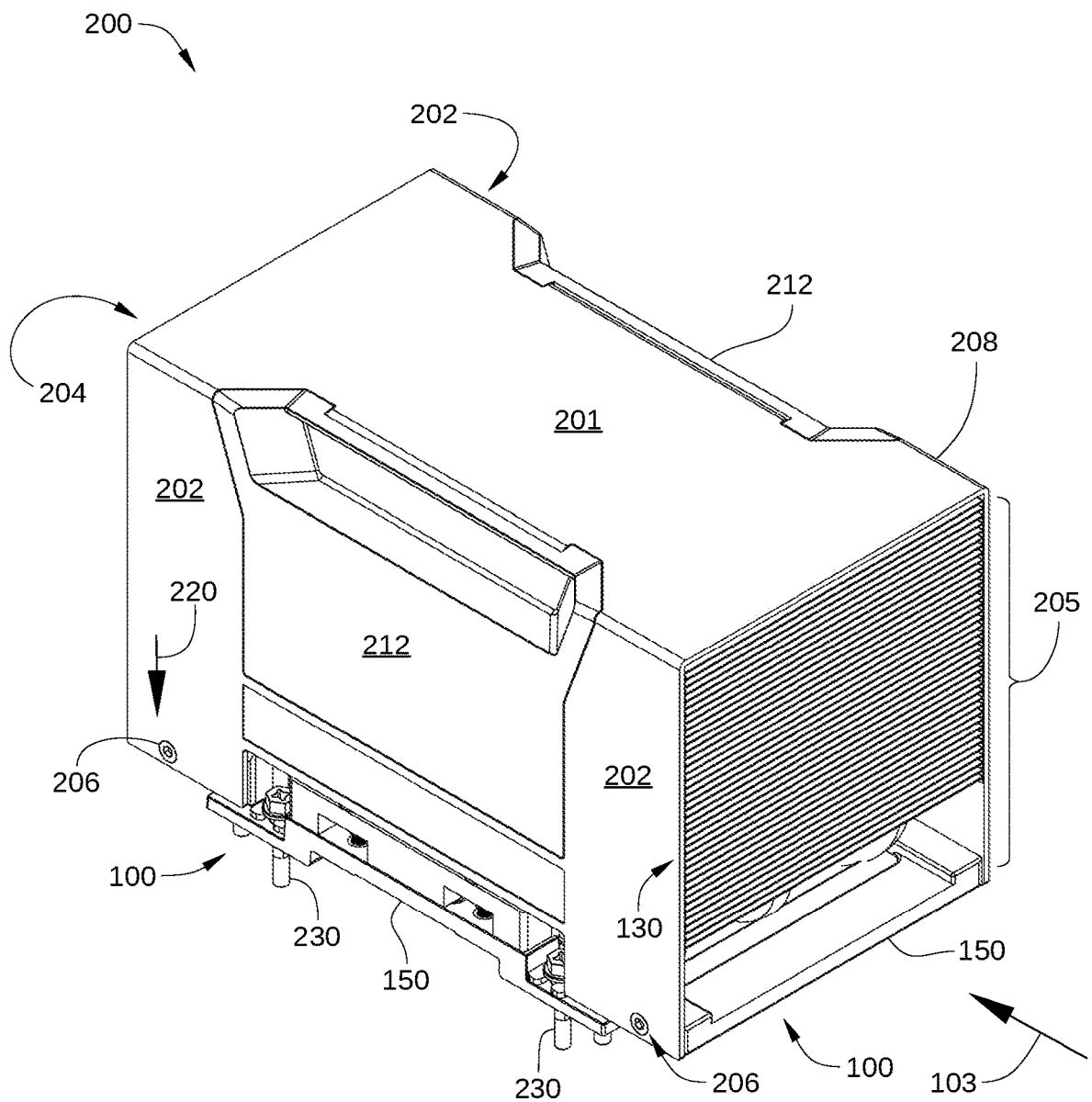
FIG. 2 is a perspective view of a heat exchanger shroud that is mounted on the heat exchanger of FIGS. 1A and 1B, according to various embodiments.

FIG. 2 is a perspective view of a heat exchanger shroud 200 mounted on heat exchanger 100, according to various embodiments. As shown, heat exchanger shroud 200 is coupled to heat exchanger 100 of FIG. 1, so that cooling fins 130 are protected by a top plate 201 that is disposed proximate a top region of cooling fins 130 and two side plates 202 disposed proximate respective edge regions of cooling fins 130. Thus, heat exchanger shroud 200 is configured to provide complete protective coverage of cooling fins 130 on three sides. By contrast, prior art shrouds typically protect only a top region of a heat sink. Therefore, unlike prior art heat exchanger shrouds, heat exchanger shroud 200 provides complete top and side coverage of heat exchanger 100. Consequently, heat exchanger 100 can be handled at top plate 201 and side plates 202 without risk of damage to cooling fins 130 or to other components of heat exchanger 100. Heat exchanger shroud 200 is also configured with two openings 204 and 205 that are positioned on opposing sides of heat exchanger shroud 200. Thus, heat exchanger shroud 200 is configured to form an air duct around a first side region of cooling fins 130 (e.g., proximate one of side plates 202), a second side region of cooling fins 130 (e.g., proximate the other of side plates 202), and a top region of cooling fins 130 (e.g., proximate top plate 201). In this way, heat exchanger shroud 200 acts as a duct that directs cooling air to flow across cooling fins 130 from one of openings 204 or 205 to the other of openings 204 or 205. Because heat exchanger shroud 200 prevents such cooling air from escaping from between and bypassing cooling fins 130, the cooling efficiency of heat exchanger 100 is improved.

In some embodiments, each side plate 202 of heat exchanger shroud 200 has a removable side shield 212 that is removably mounted on or removably attached to each side plate 202. In the embodiment illustrated in FIG. 2, only one of removable side shields 212 is visible. In some embodiments, each removable side shield 212 is configured to slide downward (denoted by direction arrow 220) onto a particular side plate 202 and over a grip surface (not visible in FIG. 2) of the particular side plate 202. The grip surface hidden in FIG. 2 is described is greater detail in conjunction with FIG. 5.

In some embodiments, heat sink 100, or an assembly that includes heat sink 100 and heat exchanger shroud 200, is configured with one or more sets of mechanical fasteners. In some embodiments, heat sink 100 includes a set of mounting fasteners 230 that are configured to removably attach heat sink 100 to a supporting substrate, such as PCB 104 in FIG. 1. Mounting fasteners 230 can include threaded fasteners, clips, or other reusable mechanical fasteners for removably attaching heat sink 100 to the supporting substrate. Additionally or alternatively, in some embodiments, mounting fasteners 230 are configured to removably attach heat sink 100 and IC 101 to a supporting substrate as a single assembly. In such embodiments, heat sink 100 may further include another set of fasteners (not visible in FIG. 2) for coupling heat sink 100 to IC 101 or a sub-assembly that includes IC 101. An example of such fasteners is described below in conjunction with FIGS. 3A-3C.

In some embodiments, top plate 201 and side plates 202 are implemented as a single piece 208. Single piece 208 can be formed from a sheet of metallic material, such as aluminum or copper, molded plastic, and the like. In the embodiment illustrated in FIG. 2, single piece 208 forming top plate 201 and side plates 202 is removably coupled to metallic plate 150 via threaded fasteners 206. In other embodiments, single piece 208 is welded, soldered, or otherwise permanently coupled to metallic plate 150.

Figure 3B:
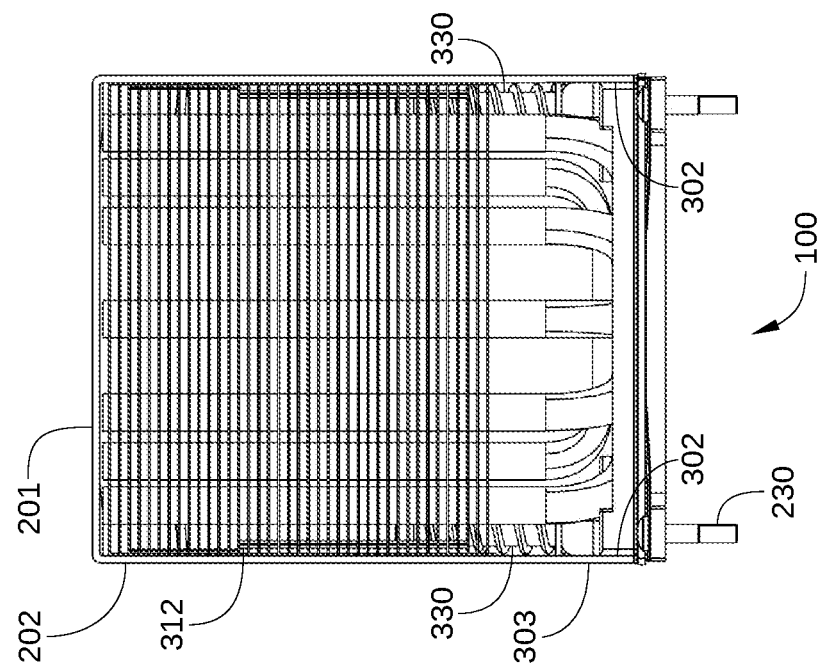
FIG. 3B is a schematic end view of the heat exchanger shroud of FIG. 2, according to various embodiments.
Figure 3A:
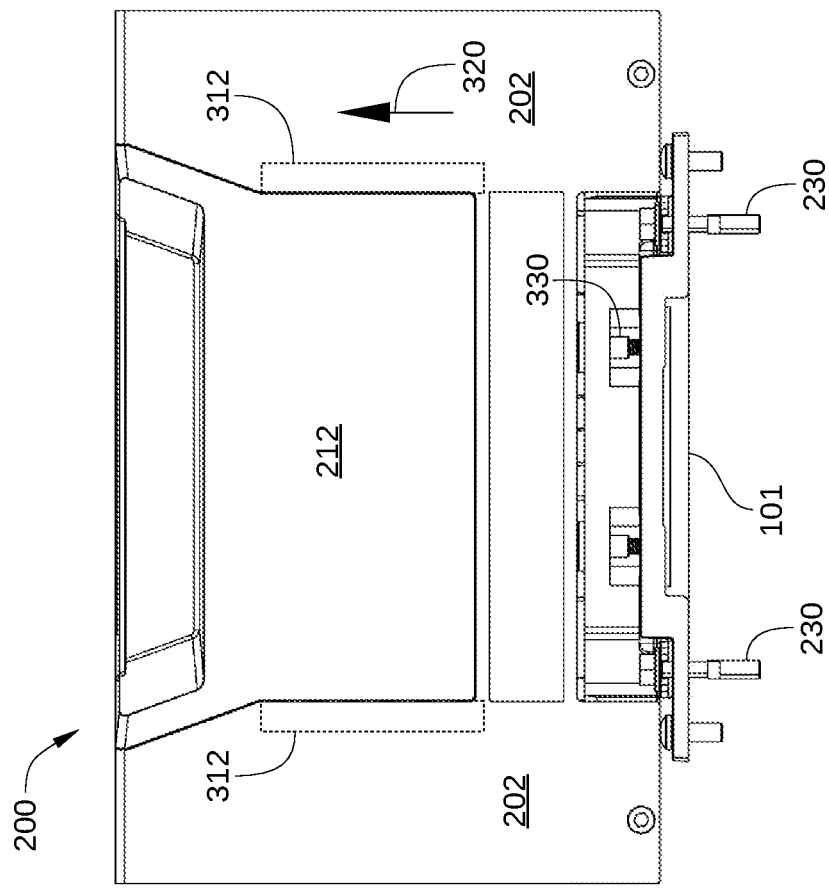
FIG. 3A is a schematic side view of the heat exchanger shroud of FIG. 2, according to various embodiments.
Figure 3C:
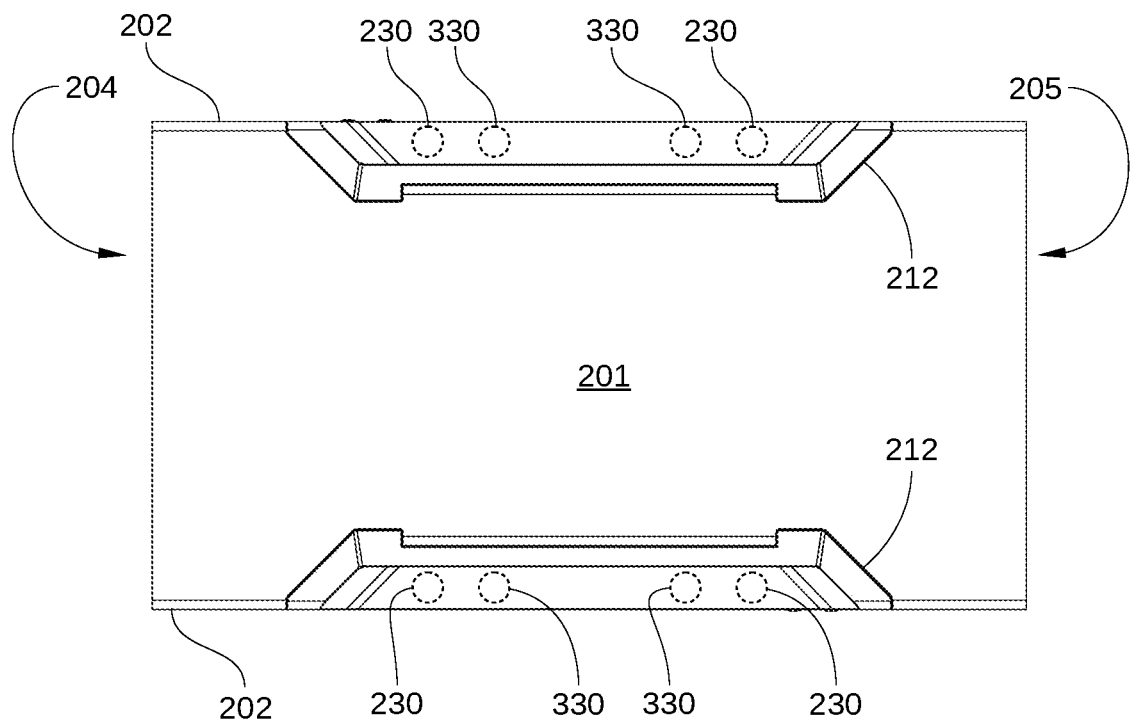
FIG. 3C is a schematic top view of the heat exchanger shroud of FIG. 2, according to various embodiments.

FIG. 3A is a schematic side view of heat exchanger shroud 200, according to various embodiments, FIG. 3B is a schematic end view of heat exchanger shroud 200, according to various embodiments, and FIG. 3C is a schematic top view of heat exchanger shroud 200, according to various embodiments. FIG. 3A illustrates heat exchanger shroud 200 as viewed in a direction perpendicular to airflow direction 103 and FIG. 3B illustrates heat exchanger shroud 200 as viewed in a direction parallel to airflow direction 103. For reference, elements of heat exchanger shroud 200 and heat sink 100 described above in conjunction with FIG. 2 are also labeled in FIGS. 3A-3C.

In the embodiment illustrated in FIGS. 3A-3C, heat exchanger shroud 200 is configured with multiple sets of mechanical fasteners, including mounting fasteners 230 and assembly fasteners 330. Assembly fasteners 330 are configured to removably couple heat sink 100 to IC 101 or to a sub-assembly that includes IC 101. As shown in FIG. 3C, mounting fasteners 230 and assembly fasteners 330 are covered by removable side shields 212 when the latter are installed on heat exchanger shroud 200. Thus, to enable access to mounting fasteners 230 and/or assembly fasteners 330, removable side shields 212 are configured to be removed. For example, in the embodiment illustrated in FIGS. 3A-3C, removable side shields 212 are configured to be removed by being slid upward (denoted by direction arrow 320) along brackets 312. Each of brackets 320 forms a track that holds a side of a removable side shield 212 in place during operation. In the embodiment illustrated in FIGS. 3A-3C, brackets 312 are disposed on inner surfaces 302 (indicated in FIG. 3B) of side plates 202. In other embodiments, brackets 312 are disposed on outer surfaces 303 (indicated in FIG. 3B) of side plates 202.

Figure 4:
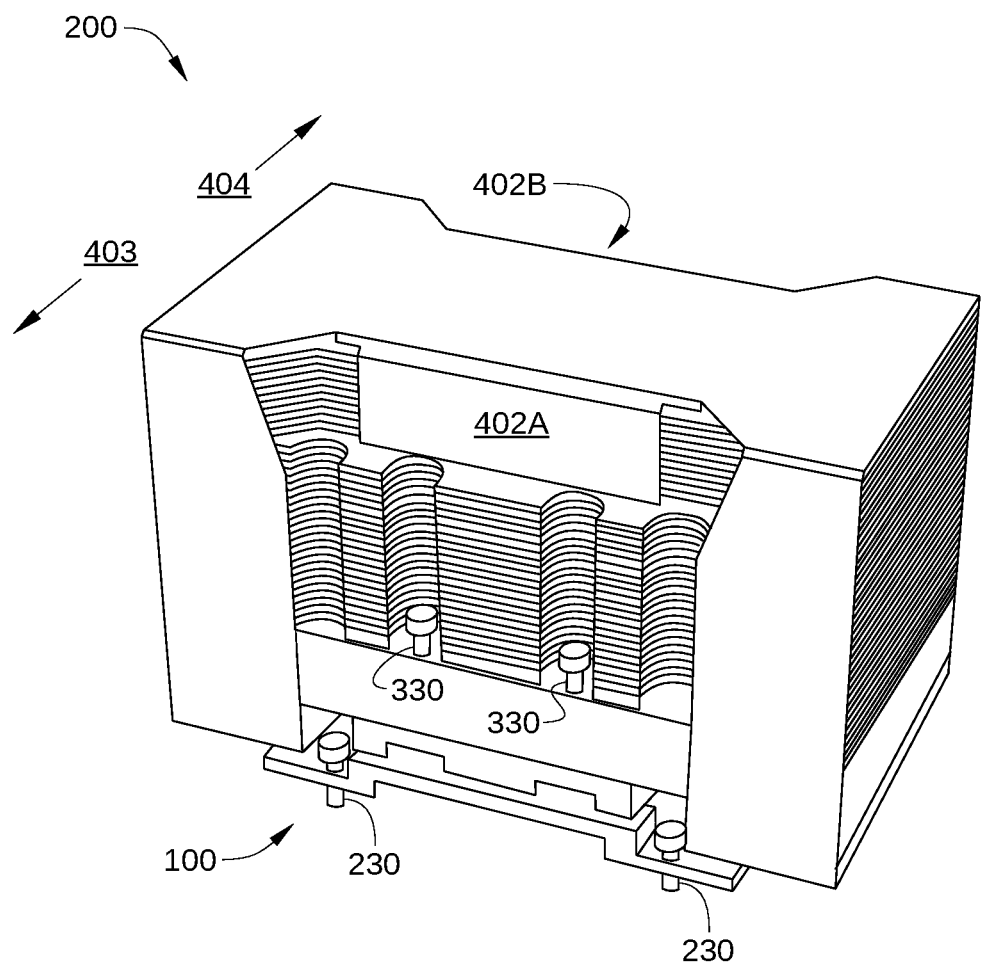
FIG. 4 is a perspective view of the heat exchanger shroud of FIG. 2 mounted on a heat exchanger with the removable side shields removed, according to various embodiments.

FIG. 4 is a perspective view of heat exchanger shroud 200 mounted on heat exchanger 100 and with removable side shields 212 removed, according to various embodiments. Heat exchanger shroud 200 is described herein with respect to heat exchanger 100 as an example. In other embodiments, heat exchanger shroud 200 can be mounted on or otherwise coupled to any other suitable IC heat exchanger. As shown, with removable side shields 212 removed, mounting fasteners 230 and assembly fasteners 330 can be accessed. Generally, access to mounting fasteners 230 enables installation of heat exchanger 100 and heat exchanger shroud 200 as a single assembly onto a supporting substrate, such as a PCB. Access to mounting fasteners 230 further enables removal of heat exchanger 100 and/or heat exchanger shroud 200 as a single assembly from such a supporting substrate. Access to assembly fasteners 330 enables assembly of heat exchanger 100 and IC 101 into a single assembly and/or removal of heat exchanger 100 from IC 101. In some embodiments, heat exchanger 100 can be removed from IC 101 while IC 101 remains coupled to a supporting substrate (not shown) via mounting fasteners 230.

When heat exchanger shroud 200 is mounted on heat exchanger 100 and removable side shields 212 are removed from heat exchanger shroud 200, a first grip surface 402A and a second grip surface 402B (referred to collectively herein as "grip surfaces 402") are exposed. In some embodiments, one grip surface 402 is disposed under each removable side shield 212. Thus, in the embodiment illustrated in FIG. 4, first grip surface 402A is disposed on a first side 403 of heat exchanger shroud 200 and second grip surface 402B is disposed on a second side of 404 of heat exchanger shroud 200, where first side 403 and second side 404 are opposing sides. In other embodiments, multiple grip surfaces 402 may be disposed under each removable side shield 212.

Because first grip surface 402A and second grip surface 402B are disposed on opposing sides of heat exchanger shroud 200, a user can firmly hold heat sink 100 and heat exchanger shroud 200 during installation and/or removal of heat sink 100 without contacting cooling fins 130. Thus, there is little or no risk of damaging cooling fins 130 when heat sink 100 and heat exchanger shroud 200 are handled.

Figure 5:
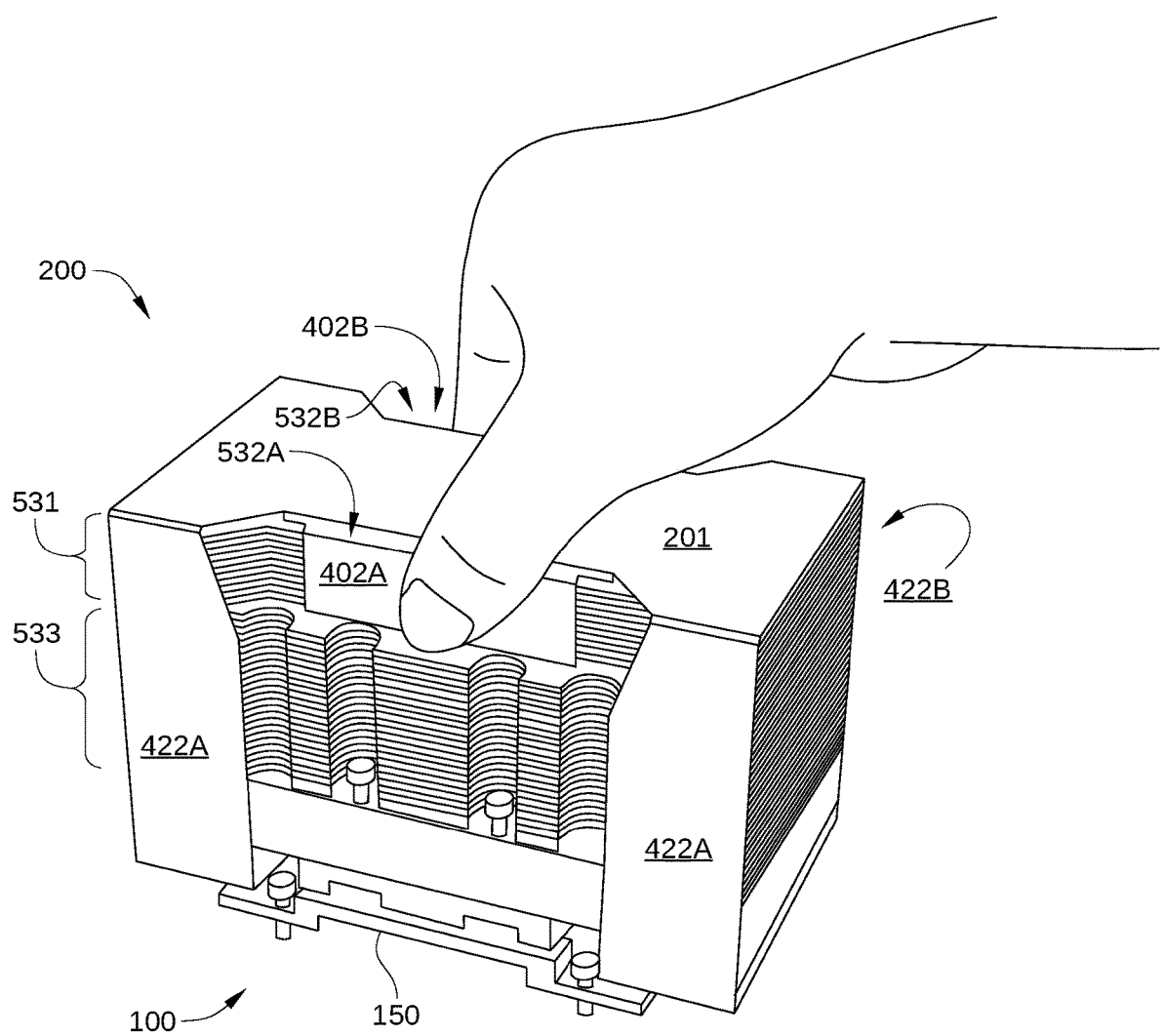
FIG. 5 is a perspective view of a user grasping heat exchanger shroud of FIG. 2 when mounted on a heat exchanger, according to various embodiments of the present disclosure.

FIG. 5 is a perspective view of a user grasping heat exchanger shroud 200 when mounted on heat exchanger 100, according to various embodiments. As shown, with removable side shields 212 removed, the user can firmly pinch first grip surface 402A and second grip surface 402B while installing and/or removing heat exchanger 100 and heat exchanger shroud 200 from a PCB.

It is noted that conventional heat exchangers for high-power chips can be relatively bulky and difficult to install on a PCB when adjacent to other components on the same PCB. For example, when an assembly that includes a heat exchanger and GPU is installed between other large components on a PCB, positioning the assembly adjacent to such components can be problematic, due to the lack of clearance between the assembly and the adjacent components. By contrast, first grip surface 402A and second grip surface 402B are inset from the side surfaces of heat exchanger shroud 200, such as a first side surface 422A and a second side surface 422B. Therefore, first grip surface 402A and second grip surface 402B can be easily grasped by a user when a large component is positioned adjacent to first side surface 422A and/or second side surface 422B.

In the embodiment illustrated in FIG. 5, first grip surface 402A is inset from first side surface 422A by a first cutout region 532A that is formed from cooling fins 130. Similarly, second grip surface 402B is inset from second side surface 422B by a second cutout region 532B that is formed from cooling fins 130. First cutout region 532A is a region that is adjacent to a first subset 531 of cooling fins 130, where each cooling fin 130 in subset 531 has an in-cut edge profile relative to cooling fins 130 in a second subset 533 of cooling fins 130. Similarly, second cutout region 532B is another region that is adjacent to first subset 531 of cooling fins 130. First subset 531 of cooling fins 130 generally includes a portion of cooling fins 130 disposed proximate top plate 201 when heat exchanger shroud 200 is installed on heat sink 100. By contrast, second subset 533 of cooling fins 130 generally includes a portion of cooling fins 130 disposed proximate metallic plate 150. First cutout region 532A and second cutout region 532B are described in more detail below in conjunction with FIGS. 6A and 6B.

Figure 6A:
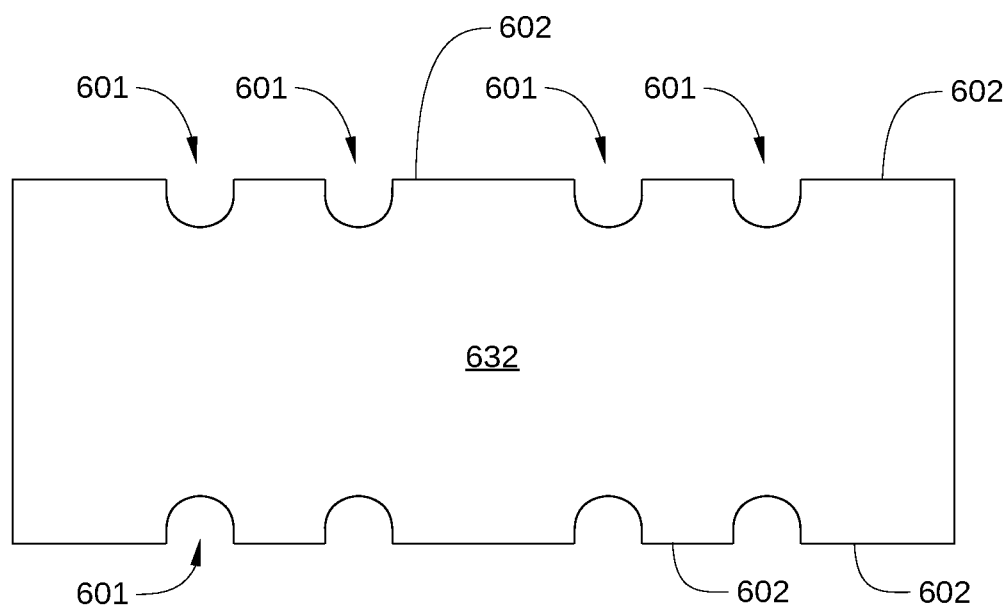
FIG. 6A schematically illustrates a plan view of an example cooling fin that can be included within a heat exchanger, according to various embodiments.

FIG. 6A schematically illustrates a plan view of a cooling fin 632 that is included in second subset 533 of cooling fins 130, according to various embodiments. As shown, cooling fin 632 is substantially rectangular in shape, with the exception of fastener access cut-outs 601. Fastener access cut-outs 601 enable access to mounting fasteners 230 and assembly fasteners 330 (not shown) during installation and/or removal of heat sink 100 from an IC or PCB. Cooling fin 632 is substantially rectangular in shape to maximize or otherwise increase surface area of cooling fin 632. Thus, cooling fin 632 includes edges 602 that are each configured to extend toward and/or contact a side plate 202 (not shown) of heat exchanger shroud 200 when heat exchanger shroud 200 is installed on heat sink 100.

Figure 6B:
FIG. 6B schematically illustrates a plan view of another example cooling fin that can be included a heat exchanger, according to various embodiments of the present disclosure.

FIG. 6B schematically illustrates a plan view of a cooling fin 631 that is included in first subset 531 of cooling fins 130, according to various embodiments. As shown, cooling fin 631 is not rectangular in shape. Instead, cooling fin 631 includes an in-cut edge profile 604 on one side that forms first cutout region 532A and an in-cut edge profile 605 on an opposing side that forms second cutout region 532B. Thus, cooling fin 631 has less surface area than cooling fin 632. Further, when heat exchanger shroud 200 is installed on heat sink 100, an edge portion 614 of cooling fin 631 that corresponds to in-cut edge profile 604 does not extend toward and/or contact a side plate 202 (not shown) of heat exchanger shroud 200. Similarly, when heat exchanger shroud 200 is installed on heat sink 100, an edge portion 615 of cooling fin 631 that corresponds to in-cut edge profile 605 does not extend toward and/or contact a side plate 202. Instead, edge portion 614 of cooling fin 631 extends toward and/or contacts first grip surface 402A (shown in FIG. 4) and edge portion 615 of cooling fin 631 extends toward and/or contacts second grip surface 402B (shown in FIG. 4).

Multiple Integrated Circuit Configuration

Figure 7:
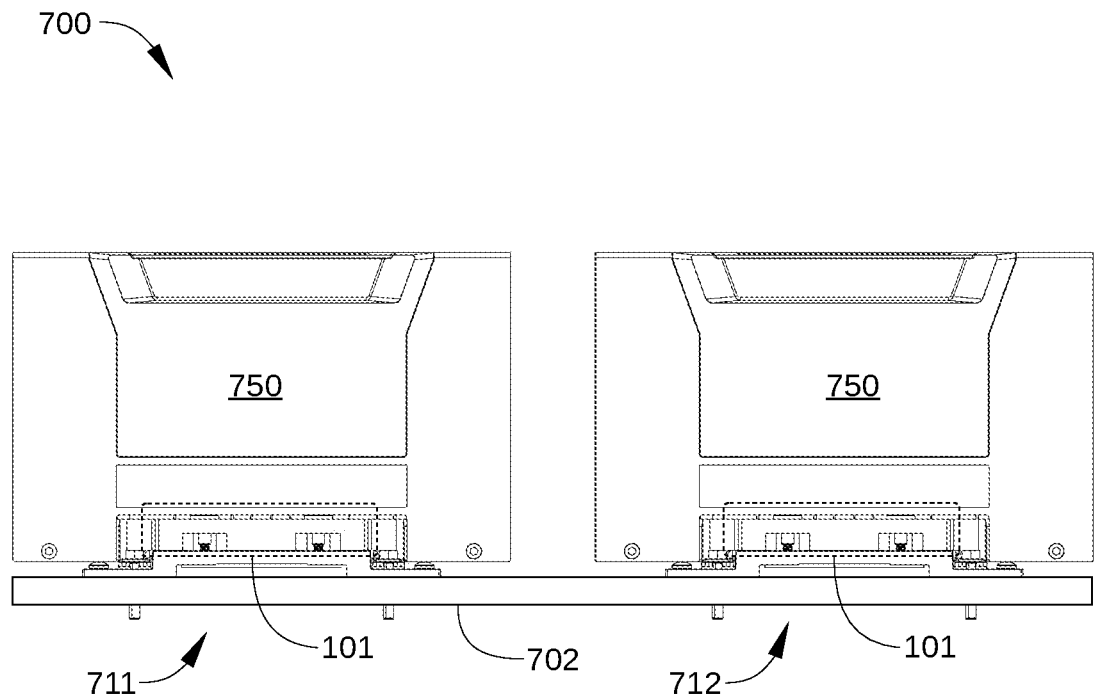
FIG. 7 is a schematic side view of a computer system that includes multiple heat exchangers, according to various embodiments.

In some embodiments, multiple ICs may be mounted on a single PCB. In such embodiments, multiple heat exchangers also can be mounted on the single PCB. One such embodiment is illustrated in FIG. 7. FIG. 7 is a schematic side view of a computer system 700 that includes multiple heat exchangers 711 and 712, according to various embodiments. In the embodiment illustrated in FIG. 7, each of heat exchangers 711 and 712 is coupled to a heat exchanger shroud 750 and an IC 101 and mounted on a single PCB 702. In some embodiments, heat exchangers 711 and 712 are positioned on PCB 702 so that cooling air (or any other cooling fluid) may flow sequentially through a first heat exchanger of an electronic device (for example heat exchanger 711) and a second heat exchanger of the electronic device (for example heat exchanger 712). That is, heat exchangers 711 and 712 are positioned on PCB 702 so that cooling air can flow through the first heat exchanger and then flow through the second heat exchanger. For example, as shown in FIG. 7, cooling fins of heat exchanger 711 are oriented parallel to the cooling fins of heat exchanger 712. Thus, sequential flow of a cooling fluid through heat exchangers 711 and 712 is facilitated.

In sum, the various embodiments shown and provided herein set forth a heat exchanger for an integrated circuit that includes a protective shroud. The protective shroud includes side covers that provide complete side coverage of heat exchanger cooling fins and a grip for handling during installation and removal. In addition, the protective shroud is configured to control or otherwise facilitate the flow of air or other cooling fluid across the cooling fins of a heat exchanger by forming a duct around the cooling fins of the heat exchanger. In some embodiments, removable side covers further protect side portions of a heat exchanger during handling, but can be removed to enable access to mounting fasteners.

At least one technical advantage of the disclosed shroud design relative to the prior art is that the disclosed design provides overall better protection of the cooling fins of a heater exchanger when the heat exchanger is being handled. Another advantage the disclosed design is improved cooling efficiency of the heat exchanger because the shroud channels cooling fluid through the cooling fins of the heat exchanger, thereby preventing the cooling fluid from bypassing the cooling fins. These technical advantages provide one or more technological advancements over prior art approaches.

1. In some embodiments, a protective shroud includes a top plate, a first side plate that is adapted to be disposed proximate a first edge region of a plurality of cooling fins of a heat exchanger for an integrated circuit, and a second side plate that is adapted to be disposed proximate a second edge region of the plurality of cooling fins.

2. The protective shroud of clause 1, wherein a single sheet of metallic material comprises the first side plate, the second side plate, and the top plate.

3. The protective shroud of clauses 1 or 2, wherein the protective shroud further comprises a first removable side cover disposed proximate a first edge region of the plurality of cooling fins and a second removable side cover disposed proximate a second edge region of the plurality of cooling fins.

4. The protective shroud of any of clauses 1-3, wherein the first removable side cover covers access to a mechanical fastener associated with the heat exchanger when installed on the protective shroud.

5. The protective shroud of any of clauses 1-4, wherein the protective shroud further comprises a first gripping surface that is covered by the first removable side cover and a second gripping surface that is covered by the second removable side cover.

6. The protective shroud of any of clauses 1-5, wherein the first gripping surface and the second gripping surface reside on opposing surfaces of the protective shroud.

7. The protective shroud of any of clauses 1-6, wherein the first removable side cover is disposed proximate a first subset of cooling fins of the plurality of cooling fins, and the second removable side cover is disposed proximate the first subset of cooling fins.

8. In some embodiments, a computer system includes an first integrated circuit mounted on a supporting substrate, a first heat exchanger that includes a first plurality of cooling fins and is thermally coupled to the first integrated circuit, and a first protective shroud. The first protective shroud includes a first top plate, a first side plate that is disposed proximate a first edge region of the first plurality of cooling fins of the first heat exchanger, and a second side plate that is disposed proximate a second edge region of the first plurality of cooling fins.

9. The computer system of clause 8, wherein the first protective shroud includes a first removable side cover disposed proximate a first edge region of the first plurality of cooling fins and a second removable side cover disposed proximate a second edge region of the first plurality of cooling fins.

10. The computer system of clauses 8 or 9, wherein the first protective shroud further comprises a first gripping surface that is covered by the first removable side cover and a second gripping surface that is covered by the second removable side cover.

11. The computer system of any of clauses 8-10, wherein the first gripping surface and the second gripping surface reside on opposing surfaces of the first protective shroud.

12. The computer system of any of clauses 8-11, wherein the first removable side cover is disposed proximate a first subset of cooling fins of the first plurality of cooling fins, and the second removable side cover is disposed proximate the first subset of cooling fins.

13. The computer system of any of clauses 8-12, wherein each cooling fin included in the first subset of cooling fins includes an in-cut edge profile.

14. The computer system of any of clauses 8-13, wherein each cooling fin in the first subset of cooling fins has a smaller surface area than each cooling fin in a second subset of cooling fins of the first plurality of cooling fins.

15. The computer system of any of clauses 8-14, further comprising a second integrated circuit mounted on the supporting substrate, a second heat exchanger that includes a second plurality of cooling fins and is thermally coupled to the second integrated circuit, and a second protective shroud. The second protective shroud includes a second top plate, a third side plate that is disposed proximate a first edge region of the second plurality of cooling fins of the first heat exchanger, and a fourth side plate that is disposed proximate a second edge region of the second plurality of cooling fins.

16. The computer system of any of clauses 8-15, wherein the first heat exchanger and the second heat exchanger are positioned on the supporting substrate so that a cooling fluid can flow through the first heat exchanger and then through the second heat exchanger.

17. The computer system of any of clauses 8-16, wherein the integrated circuit comprises one of a central-processing unit and a graphics processing unit.

18. In some embodiments, a protective shroud includes a first side plate with a first removable side cover that is adapted to be disposed proximate a first edge region of a plurality of cooling fins of a heat exchanger for an integrated circuit, a second side plate with a second removable side cover that is adapted to be disposed proximate a second edge region of the plurality of cooling fins, and a top plate that is adapted to be disposed proximate a top region of the plurality of cooling fins.

19. The protective shroud of clause 18, wherein the first removable side cover covers access to a mechanical fastener associated with the heat exchanger when installed on the protective shroud.

20. The protective shroud of clauses 18 or 19, wherein the first side plate, the second side plate, and the top plate are adapted to form a duct around the plurality of cooling fins.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

While the preceding is directed to embodiments of the present disclosure, other and further embodiments of the disclosure may be devised without departing from the basic scope thereof, and the scope thereof is determined by the claims that follow.

What is claimed is:

1. A protective shroud, comprising:
   a top plate that includes a first inset region and a first gripping surface, wherein the first inset region is inset from an edge of the top plate, and at least a portion of the first inset region is attached to the first gripping surface;
   a first side plate assembly that is adapted to be disposed proximate a first edge region of a plurality of cooling fins of a heat exchanger for an integrated circuit, wherein at least a portion of the first side plate assembly is removable and covers the first gripping surface of the top plate; and
   a second side plate that is adapted to be disposed proximate a second edge region of the plurality of cooling fins.

2. The protective shroud of claim 1, wherein a single sheet of metallic material comprises at least a second portion of the first side plate, the second side plate, and the top plate.

3. The protective shroud of claim 1, wherein the at least the portion of the first side plate assembly comprises a first removable side cover disposed proximate the first edge region of the plurality of cooling fins, and the protective shroud further comprises a second removable side cover disposed proximate the second edge region of the plurality of cooling fins.

4. The protective shroud of claim 3, wherein the first removable side cover covers access to a mechanical fastener associated with the heat exchanger when installed on the protective shroud.

5. The protective shroud of claim 3, wherein the protective shroud further comprises a second gripping surface that is covered by the second removable side cover.

6. The protective shroud of claim 5, wherein the first gripping surface and the second gripping surface reside on opposing surfaces of the protective shroud.

7. The protective shroud of claim 6, wherein the first removable side cover is disposed proximate a first subset of cooling fins of the plurality of cooling fins, and the second removable side cover is disposed proximate the first subset of cooling fins.

8. A computer system, comprising:
   a first integrated circuit mounted on a supporting substrate;
   a first heat exchanger that includes a first plurality of cooling fins and is thermally coupled to the first integrated circuit; and
   a first protective shroud that includes:
      a first top plate that includes a first inset region and a first gripping surface, wherein the first inset region is inset from an edge of the top plate, and at least a portion of the first inset region is attached to the first gripping surface;
      a first side plate assembly that is disposed proximate a first edge region of the first plurality of cooling fins of the first heat exchanger, wherein at least a portion of the first side plate assembly is removable and covers the first gripping surface of the top plate; and
a second side plate that is disposed proximate a second edge region of the first plurality of cooling fins.

9. The computer system of claim 8, wherein the at least the portion of the first side plate assembly includes a first removable side cover disposed proximate the first edge region of the first plurality of cooling fins, and the first protective shroud further includes a second removable side cover disposed proximate the second edge region of the first plurality of cooling fins.

10. The computer system of claim 9, wherein the first protective shroud further comprises a second gripping surface that is covered by the second removable side cover.

11. The computer system of claim 10, wherein the first gripping surface and the second gripping surface reside on opposing surfaces of the first protective shroud.

12. The computer system of claim 11, wherein the first removable side cover is disposed proximate a first subset of cooling fins of the first plurality of cooling fins, and the second removable side cover is disposed proximate the first subset of cooling fins.

13. The computer system of claim 12, wherein each cooling fin included in the first subset of cooling fins includes an in-cut edge profile.

14. The computer system of claim 13, wherein each cooling fin in the first subset of cooling fins has a smaller surface area than each cooling fin in a second subset of cooling fins of the first plurality of cooling fins.

15. The computer system of claim 8, further comprising:
a second integrated circuit mounted on the supporting substrate;
a second heat exchanger that includes a second plurality of cooling fins and is thermally coupled to the second integrated circuit; and
a second protective shroud that includes:
a second top plate;
a third side plate that is disposed proximate a first edge region of the second plurality of cooling fins of the first heat exchanger; and
a fourth side plate that is disposed proximate a second edge region of the second plurality of cooling fins.

16. The computer system of claim 15, wherein the first heat exchanger and the second heat exchanger are positioned on the supporting substrate so that a cooling fluid can flow through the first heat exchanger and then through the second heat exchanger.

17. The computer system of claim 8, wherein the integrated circuit comprises one of a central-processing unit and a graphics processing unit.

18. A protective shroud, comprising:
a first side plate with a first removable side cover that is adapted to be disposed proximate a first edge region of a plurality of cooling fins of a heat exchanger for an integrated circuit;
a second side plate with a second removable side cover that is adapted to be disposed proximate a second edge region of the plurality of cooling fins; and
a top plate that is adapted to be disposed proximate a top region of the plurality of cooling fins, wherein the top plate includes a first inset region and a first gripping surface, the first inset region is inset from an edge of the top plate, at least a portion of the first inset region is attached to the first gripping surface, and the first removable side cover covers the first gripping surface of the top plate.

19. The protective shroud of claim 18, wherein the first removable side cover covers access to a mechanical fastener associated with the heat exchanger when installed on the protective shroud.

20. The protective shroud of claim 18, wherein the first side plate, the second side plate, and the top plate are adapted to form a duct around the plurality of cooling fins.

21. The protective shroud of claim 1, wherein at least a second portion of the first side panel assembly is fixed.

22. The computer system of claim 8, wherein at least a second portion of the first side panel assembly is fixed.

* * * * *